United States Patent
Wang et al.

(10) Patent No.: US 12,538,572 B2
(45) Date of Patent: Jan. 27, 2026

(54) DISPLAY SUBSTRATE AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Qiwei Wang, Beijing (CN); Yue Long, Beijing (CN); Zhi Wang, Beijing (CN); Lili Du, Beijing (CN); Yuanyou Qiu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/977,491

(22) Filed: Dec. 11, 2024

(65) Prior Publication Data

US 2025/0107241 A1    Mar. 27, 2025

Related U.S. Application Data

(63) Continuation of application No. 18/435,073, filed on Feb. 7, 2024, now Pat. No. 12,211,858, which is a
(Continued)

(51) Int. Cl.
*H01L 27/12* (2006.01)
*G09G 3/32* (2016.01)
(Continued)

(52) U.S. Cl.
CPC ............ *H10D 86/411* (2025.01); *G09G 3/32* (2013.01); *H10D 86/441* (2025.01);
(Continued)

(58) Field of Classification Search
CPC ... G09G 2320/0233; G09G 2320/0276; G09G 2320/0626; G09G 3/3233; G09G 3/20;
(Continued)

(56) References Cited

U.S. PATENT DOCUMENTS

2022/0068211 A1* 3/2022 Jeong ................... G09G 3/3233

FOREIGN PATENT DOCUMENTS

| CN | 107633812 A | 1/2018 |
|---|---|---|
| CN | 114730797 A | 7/2022 |
| WO | 2020133950 A1 | 7/2020 |

OTHER PUBLICATIONS

Chinese First Office Action, mailed Feb. 28, 2025, from CN Patent Application No. 202080002592.4, 12 pages.

* cited by examiner

*Primary Examiner* — Dong Hui Liang
(74) *Attorney, Agent, or Firm* — Workman Nydegger

(57) ABSTRACT

Disclosed are a display substrate and a display device. The display substrate includes: a display area and a bezel area, the display area including a first display area and a second display area; a plurality of light emitting devices, a plurality of pixel driving circuits, a plurality of data lines, and a plurality of first wires in the second display area and extending in a row direction, where all the first wires are located at a plurality of row gaps adjacent to the first display area respectively, each of the plurality of first wires is connected between one data line corresponding to the first display area and one first pixel driving circuit corresponding to the one data line.

20 Claims, 13 Drawing Sheets

Related U.S. Application Data continuation of application No. 18/250,331, filed as application No. PCT/CN2020/125230 on Oct. 30, 2020, now Pat. No. 11,935,902.

(51) Int. Cl.
*H10D 86/40* (2025.01)
*H10D 86/60* (2025.01)

(52) U.S. Cl.
CPC ..... *H10D 86/60* (2025.01); *G09G 2300/0408* (2013.01); *G09G 2300/0413* (2013.01); *G09G 2300/0819* (2013.01); *G09G 2310/0286* (2013.01)

(58) Field of Classification Search
CPC ......... G09G 3/2003; G09G 2300/0465; G09G 2354/00
See application file for complete search history.

DISPLAY SUBSTRATE AND DISPLAY DEVICE

CROSS REFERENCE TO RELATED APPLICATIONS

The present disclosure is a continuation of U.S. patent application Ser. No. 18/435,073, filed on Feb. 7, 2024, which is a continuation of U.S. patent application Ser. No. 18/250, 331, filed on Apr. 24, 2023, which is a national phase entry under 35 U.S.C § 371 of International Application No. PCT/CN2020/125230, filed on Oct. 30, 2020, which is hereby incorporated by reference in its entirety.

FIELD

The present disclosure relates to the technical field of display, and particularly relates to a display substrate and a display device.

BACKGROUND

As smart phones develop at a high speed, users require not only attractive appearance but better visual experience of the smart phones. Accordingly, manufacturers attempt to increase a screen-to-body ratio of the smart phones, and launch competition for a full screen. The demand for improvement in performance and function of the full screen keeps increasing with advancing years. Without influencing a high screen-to-body ratio, an under-display camera can create a rush of excitement in visual and use experience to a certain extent.

SUMMARY

In an aspect, an embodiment of the present disclosure provides a display substrate, including:
  a base substrate, where the base substrate includes a display area and a bezel area surrounding the display area, the display area includes a first display area and a second display area at least located at a side of the first display area;
  a plurality of light emitting devices, arranged in an array on the base substrate, where the plurality of light emitting devices include a plurality of first light emitting devices in the first display area and a plurality of second light emitting devices in the second display area;
  a plurality of pixel driving circuits, arranged between the base substrate and the plurality of light emitting devices, where the plurality of pixel driving circuits include: a plurality of first pixel driving circuits in the bezel area and a plurality of second pixel driving circuits in the second display area, the plurality of first pixel driving circuits are electrically connected with the plurality of first light emitting devices,
  a plurality of data lines, arranged in the second display area, where each of the plurality of data line is connected with the first pixel driving circuits electrically connected with one column of the first light emitting devices and the second pixel driving circuits electrically connected with one column of the second light emitting devices, and the one column of the first light emitting devices and the one column of the second light emitting devices are arranged in a same column; and
  a plurality of first wires in the second display area and extending in a row direction, where the plurality of first wires are located at a plurality of row gaps adjacent to the first display area respectively, each of the plurality of first wires is connected between one data line corresponding to the first display area and one first pixel driving circuit corresponding to the one data line.

In some embodiments, two first wires of the plurality of first wires are arranged at a same row gap in the second display area.

In some embodiments, the two first wires arranged at a same row gap are symmetrically arranged about a first axis of symmetry of the first display area;
  where the first axis of symmetry is an axis of symmetry of the first display area extending in a column direction.

In some embodiments, a first end of the first wire is connected with the data line; a distance between first ends of the two first wires arranged at the same row gap is a first distance; the first distance gradually increases in the column direction far away from the first display area.

In some embodiments, the display substrate further includes: a plurality of second wires in the second display area and extending in a column direction; where the plurality of second wires are arranged at a plurality of column gaps at two sides of the first display area in the row direction; each of the plurality of second wires is electrically connected between one first wire and one first pixel driving circuit corresponding to the one first wire; and each of the plurality of second wires is electrically connected with the one first pixel driving circuit.

In some embodiments, the one data line corresponding to the first display area is connected with at least one of the plurality of second wires by means of one first wire; all first light emitting devices connected with the at least one of the plurality of second wires connected with the one first wires are located in a same column.

In some embodiments, the plurality of first pixel driving circuits are electrically connected with the plurality of first light emitting devices in one-to-one correspondence, and the plurality of second pixel driving circuits are electrically connected with the plurality of second light emitting devices in one-to-one correspondence.

In some embodiments, a number of the all second wires connected with the one first wire is equal to a number of the first light emitting devices in one column in the first display area.

In some embodiments, the display substrate further includes: a plurality of first transfer lines arranged in a portion of the bezel area adjacent to the first display area, where each first transfer line is correspondingly connected with one second wire and one first pixel driving circuit.

In some embodiments, the display substrate further includes: a first gate metal layer, a second gate metal layer, a first source-drain metal layer and a second source-drain metal layer, where the first gate metal layer, the second gate metal layer, the first source-drain metal layer and the second source-drain metal layer are stacked and insulated from each other; the plurality of data lines and the plurality of first transfer lines are arranged in a same layer as the first source-drain metal layer; the plurality of first wires are arranged in a same layer as the second gate metal layer; and the plurality of second wires are arranged in a same layer as the second source-drain metal layer.

In some embodiments, the display substrate further includes: a plurality of cascaded shift registers in the bezel area; where each of the plurality of cascaded shift register is correspondingly connected with the first pixel driving circuits electrically connected with one row of the first light emitting devices and the second pixel driving circuits electrically connected with one row of the second light emitting devices; and the one row of the first light emitting devices and the one row of the second light emitting devices are arranged in a same row.

In some embodiments, the bezel area includes: a first bezel area adjacent to the first display area, a second bezel area opposite the first bezel area, and a third bezel area connected with the first bezel area and the second bezel area, and a fourth bezel area connected with the first bezel area and the second bezel area; the plurality of first pixel driving circuits are arranged in the first bezel area; the plurality of cascaded shift registers are arranged in at least one of the third bezel area or the fourth bezel area; and where the display substrate further includes: a plurality of connecting lines are arranged in at least one of: the third bezel area adjacent to the first display area, the fourth bezel area adjacent to the first display area, or the first bezel area; one end of each of the plurality of connecting lines is correspondingly connected with one shift register, the other end of each of the plurality of connecting line is correspondingly connected with at least one first pixel driving circuit; and the first light emitting devices electrically connected with at least one first pixel driving circuit are arranged in a same row.

In some embodiments, the plurality of cascaded shift registers are divided into two groups, where one group of cascaded shift registers are at least arranged in the third bezel area, and the other group of cascaded shift registers are at least arranged in the fourth bezel area; the plurality of first pixel driving circuits are arranged in the first bezel area; and the plurality of connecting lines are arranged in the third bezel area adjacent to the first display area, the fourth bezel area adjacent to the first display area, and the first bezel area; where each of the plurality of connecting lines is correspondingly connected with one shift register and the plurality of first pixel driving circuits adjacent to a half row of first light emitting devices.

In some embodiments, the display substrate further includes: a first gate metal layer, a second gate metal layer, a first source-drain metal layer and a second source-drain metal layer; where the first gate metal layer, the second gate metal layer, the first source-drain metal layer and the second source-drain metal layer are stacked and insulated from each other; the plurality of connecting lines are arranged in a same layer as at least one of the first gate metal layer, the second gate metal layer or the second source-drain metal layer.

In some embodiments, each group of cascaded shift registers include: a plurality of first cascaded shift registers and a plurality of second cascaded shift registers; and the plurality of connecting lines include: a plurality of first connecting lines arranged in a same layer as at least one of the first gate metal layer, the second gate metal layer or the second source-drain metal layer; and a plurality of second connecting lines arranged in a same layer as at least one of the first gate metal layer or the second gate metal layer; where each of the plurality of first connecting lines is electrically connected with one first shift register and the plurality of first pixel driving circuits adjacent to a half row of first light emitting devices correspondingly; and each of the plurality of second connecting lines is electrically connected with one second shift register and the plurality of first pixel driving circuits adjacent to a half row of first light emitting devices correspondingly.

In some embodiments, the plurality of first cascaded shift registers are arranged between the plurality of second cascaded shift registers and the display area; each of the plurality of first connecting lines is bent from one side of the first shift register closer to the display area to the first bezel area between the first pixel driving circuit and the display area; and each of the plurality of second connecting lines is bent from one side of the second shift register farther away from the display area to the first bezel area between the first pixel driving circuit and the display area.

In some embodiments, the display substrate further includes: a plurality of second transfer lines and a plurality of third transfer lines arranged in the first bezel area and in a same layer as the first source-drain metal layer, where each of the plurality of second transfer lines is connected with one first connecting line and one first pixel driving circuit; and each of the plurality of third transfer lines is connected with one second connecting line and one first pixel driving circuit.

In some embodiments, the display substrate further includes: a plurality of gate lines and a plurality of light emitting control lines arranged in the second display area and in a same layer as the first gate metal layer; and a plurality of fourth transfer lines and a plurality of fifth transfer lines arranged in the third bezel area and the fourth bezel area and in a same layer as the first source-drain metal layer, where each of the plurality of gate lines is electrically connected with a half row of second pixel driving circuits, and the each of the plurality of gate lines is electrically connected with one first shift register by means of one fourth transfer line; and each of the plurality of light emitting control lines is electrically connected with a half row of second pixel driving circuits, and the each of the plurality of light emitting control lines is electrically connected with one second shift register by means of one fifth transfer line.

In some embodiments, the display substrate further includes: a plurality of power signal lines extending in a column direction; where one power signal line is electrically connected with one column of the second pixel driving circuits, or one power signal line is electrically connected with the first pixel driving circuits and the second pixel driving circuits in a same column;

where the display substrate further including: a plurality of initialization signal lines extending in a row direction in the second display area, and a plurality of sixth transfer lines arranged in the bezel area, where one initialization signal line is electrically connected with a half row of second pixel driving circuits; and each of the plurality of initialization signal lines located at two sides of the first display area in the row direction is further electrically connected with the first pixel driving circuits corresponding to a row of first light emitting devices by means of one sixth transfer line.

In another aspect, an embodiment of the present disclosure further provides a display device. The display device includes: a light extraction device, and the display substrate provided in embodiments of the present disclosure, where the light extraction device is arranged in a first display area of the display substrate; the light extraction device includes a camera component, an optical fingerprint recognition component, or an ambient light sensor.

DETAILED DESCRIPTION OF THE EMBODIMENTS

Figure 1:
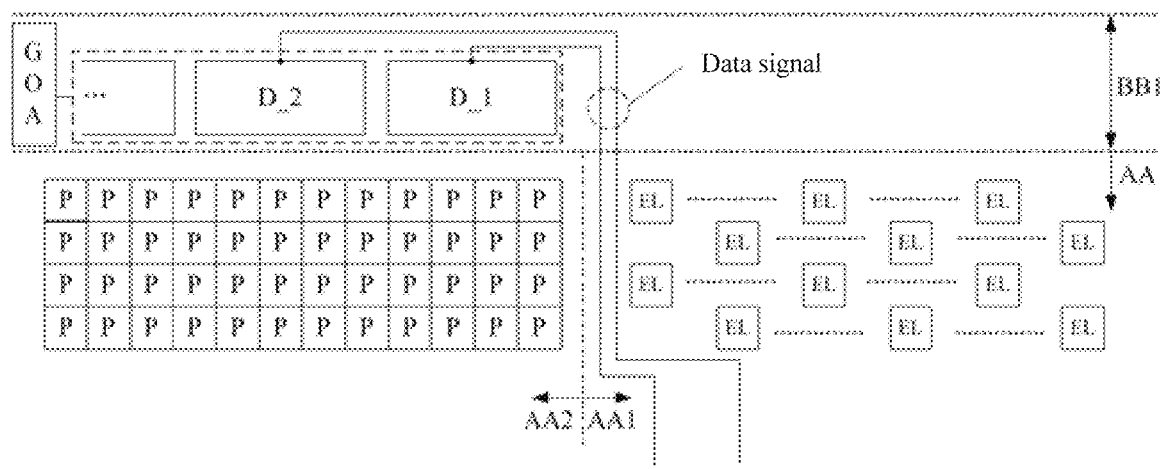
FIG. 1 is a schematic structural diagram of a display device with an under-display camera in the related art.

For making objectives, technical solutions and advantages of embodiments of the present disclosure clearer, the technical solutions of the embodiments of the present disclosure will be clearly and completely described below in conjunction with the accompanying drawings in the embodiments of the present disclosure. It should be noted that a size and a shape of each figure in the drawings do not reflect a true scale, but only for illustrating the present disclosure. Throughout the drawings, identical or similar reference numerals denote identical or similar elements or elements having identical or similar functions. Apparently, the embodiments described are some embodiments rather than all embodiments of the present disclosure. Based on the embodiments of the present disclosure, all other embodiments obtained by those of ordinary skill in the art without making creative efforts fall within the scope of protection of the present disclosure.

Unless otherwise defined, technical or scientific terms used herein should have ordinary meanings as understood by those of ordinary skill in the art to which the present disclosure belongs. "First", "second" and similar words used in the description and claims of the present disclosure do not indicate any order, amount or importance, but only for distinguishing different components. "Include", "comprise", and other similar words indicate that elements or objects before the word include elements or objects after the word and their equivalents, without excluding other elements or objects. "Inside", "outside", "upper", "lower", etc. are only used to indicate a relative positional relation. After an absolute position of the described object changes, the relative positional relation may also change accordingly.

FIG. 1 is a schematic planar structural diagram of a display device with an under-display camera in the related art. As shown in FIG. 1, the display device includes: a first display area AA1 and a second display area AA2, and a camera may be arranged in the first display area AA1, a plurality of light emitting devices EL are arranged in the first display area AA1, and pixel driving circuits (for example, D_1 and D_2 in FIG. 1) for controlling the light emitting devices EL to emit light are located in an upper bezel area BB1; and a plurality of pixel driving circuits P are arranged in the second display area AA2, and each pixel driving circuit P includes one light emitting device and a corresponding driving circuit, that is, the driving circuit in the pixel driving circuit P is located near the corresponding light emitting device.

However, as shown in FIG. 1, for the pixel driving circuits (for example, D_1 and D_2 in FIG. 1) placed in the upper bezel area BB1 in the related art, data lines providing data signals Data are generally wound around an edge of the first display area AA1 to reach the pixel driving circuits (for example, D_1 and D_2 in FIG. 1) through one or more film layers. Through the wiring method, a part of a light transmission area of the first display area AA1 may be occupied, and further a photographing effect may be influenced. Meanwhile, after the data line is wound from the edge of the first display area AA1 to the upper bezel area BB1, the data line needs to be transversely connected with the corresponding pixel driving circuit. In this way, a part of a bezel area may be occupied, and further a wiring space is limited or the bezel area is increased.

Figure 2:
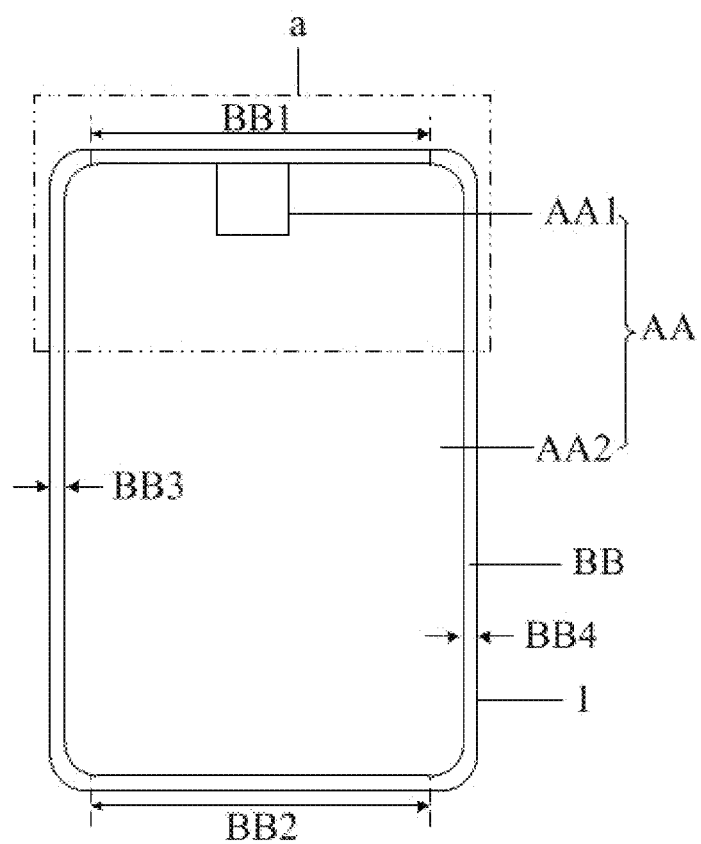
FIG. 2 is a schematic structural diagram of a display device according to an embodiment of the present disclosure.
Figure 3:
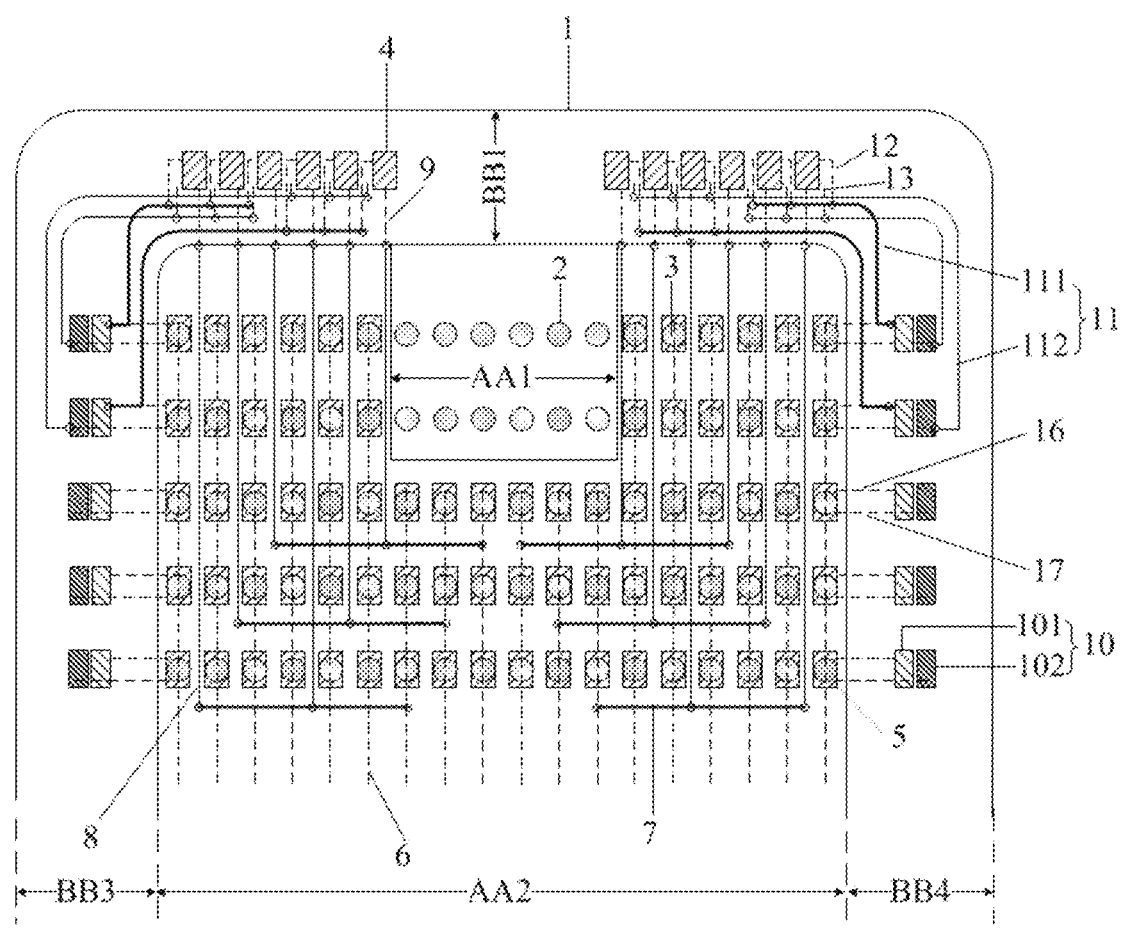
FIG. 3 is an enlarged schematic structural diagram of area a in FIG. 2.
Figure 4:
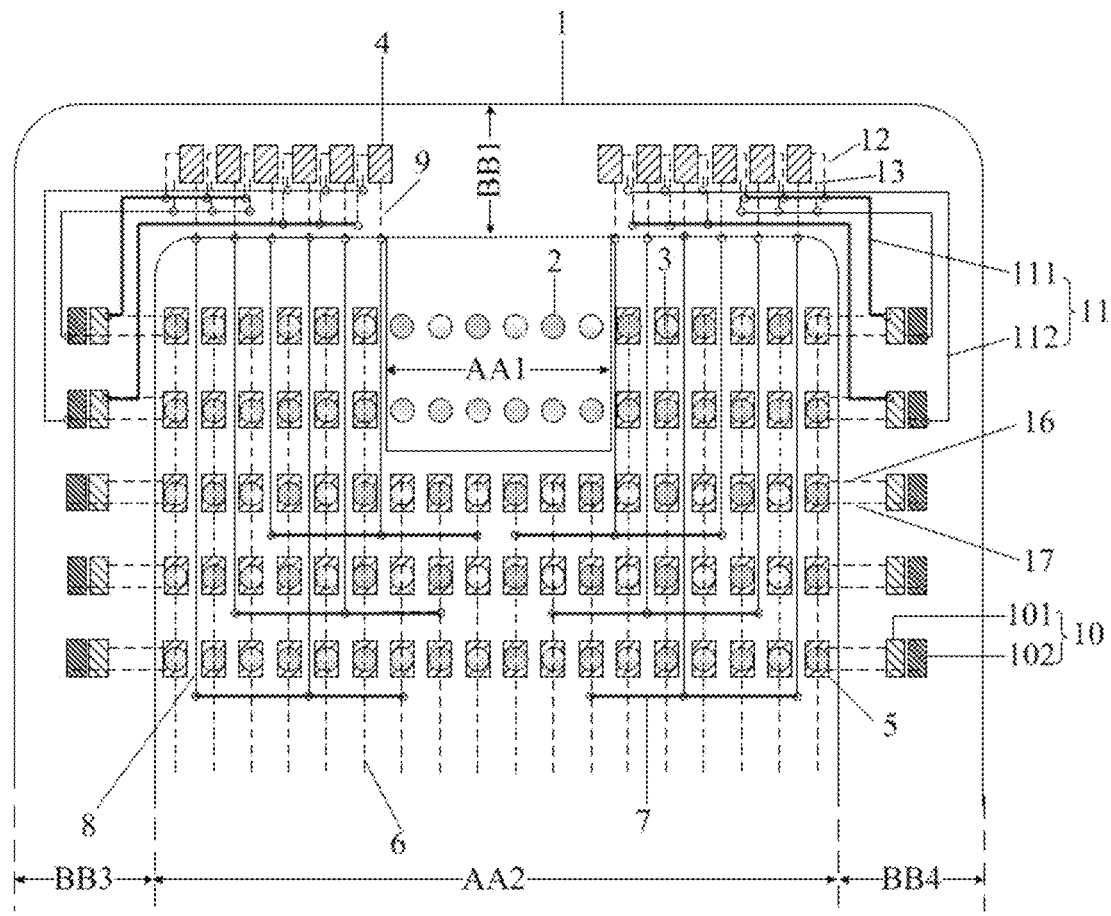
FIG. 4 is another enlarged schematic structural diagram of area a in FIG. 2.

To solve the technical problems existing in the related art, an embodiment of the present disclosure provides a display substrate. As shown in FIGS. 2 to 4, the display substrate includes:

a base substrate 1, where the base substrate 1 includes a display area AA and a bezel area BB surrounding the display area AA, where the display area AA includes a first display area AA1 and a second display area AA2 at least located at one side of the first display area AA1;

a plurality of light emitting devices arranged in an array on the base substrate 1, where the plurality of light emitting devices include a plurality of first light emitting devices 2 located in the first display area AA1 and a plurality of second light emitting devices 3 located in the second display area AA2;

a plurality of pixel driving circuits arranged between the base substrate 1 and a layer where the plurality of light emitting devices are located, where the plurality of pixel driving circuits include a plurality of first pixel driving circuits 4 located in the bezel area BB and a plurality of second pixel driving circuits 5 located in the second display area AA2, where the plurality of first pixel driving circuits 4 are electrically connected with the plurality of first light emitting devices 2 in one-to-one correspondence, and the plurality of second pixel driving circuits 5 are electrically connected with the plurality of second light emitting devices 3 in one-to-one correspondence; and a plurality of data lines 6 located in the second display area AA2, where each data line 6 is correspondingly connected with the first pixel driving circuits 4 electrically connected with one column of the first light emitting devices 2 and the second pixel driving circuits 5 electrically connected with one column of the second light emitting devices 3, and the one column of the first light emitting devices 2 and the one column of the second light emitting devices 3 are arranged in the same column.

In the display substrate provided in the embodiment of the present disclosure, data lines 6 are shared by the first pixel driving circuits 4 electrically connected with the first light emitting devices 2 in one column and the second pixel driving circuits 5 electrically connected with the second light emitting devices 3 in the same column in the second display area AA2, such that winding in the first display area AA1 to provide data signals for the first pixel driving circuits 4 is avoided, and further a photographing effect of an under-display camera is improved.

It should be noted that in the present disclosure, a density of the plurality of first light emitting devices 2 in the first display area AA1 is the same as that of the plurality of second light emitting devices 3 in the second display area AA2, such that an overall display effect is improved. Moreover, in the present disclosure, the first light emitting devices 2 and the second light emitting devices 3 refer to pixels actually configured to display light emission, which exclude dummy pixels, a dummy pixel has a laminated structure composed of an anode, a light emitting (EL) layer and a cathode but is not configured to emit light due to no connection to a signal line. Similarly, the first pixel driving circuits 4 and the second pixel driving circuits 5 are configured to be connected with light emitting pixels. In addition, in the present disclosure, the first display area AA1 may be in a square shape as shown in FIG. 1, or a circular shape or other shapes, which may be designed according to actual needs and is not limited herein.

In some embodiments, as shown in FIGS. 3 to 7, the display substrate provided in the embodiment of the present disclosure may further include: a plurality of first wires 7 extending in a row direction and a plurality of second wires 8 extending in a column direction in the second display area AA2. The data line 6 corresponding to the first display area AA1 is connected with at least one second wire 8 by means of one first wires 7, each second wire 8 is electrically connected with one first pixel driving circuit 4 correspondingly, and the first light emitting devices 2 corresponding to the first pixel driving circuits 4 electrically connected with the at least one second wire 8 are arranged in the same column.

The data signals provided by the data lines 6 are transferred to the first pixel driving circuits 4 via the first wires 7 and the second wires 8 arranged in the second display area AA2, such that winding in the first display area AA1 to provide data signals for the first pixel driving circuits 4 is avoided, and further a photographing effect of an under-display camera is improved. Meanwhile, arrangement and optimization of the first wires 7 extending in the row direction are completed in the second display area AA2, and wiring pressure of other signal lines in the upper bezel area BB1 is reduced.

It should be noted that "the data line corresponding to the first display area" in the present disclosure indicates that an extension line of the data line 6 overlaps with the first display area AA1.

In some embodiments, in order to prevent cross-talk between the data signals, an additional transverse wiring space required by one first wires 7 may be reserved in a conventional 7T1C pixel driving circuit and be configured to allow the data line 6 to be transferred from the first source-drain metal layer to the second gate metal layer where the first wires 7 is located; and an additional longitudinal wiring space required by one second wire 8 may be reserved and be configured to allow the first wires 7 to be transferred from the second gate metal layer to the second source-drain metal layer where the second wire 8 is located. Positions of transfer holes may be adjacent to each other, and may also be determined according to a specific size and structure of a pixel, and a specific position is not limited. In addition, the first wires 7 may be arranged in alternate rows, and the second wires 8 may be arranged in alternate columns. Specific positions of the first connecting lines and the second wires in the conventional 7T1C pixel driving circuit are not limited on the premise of not influencing all functions of an original 7T1C pixel driving circuit.

Figure 5:
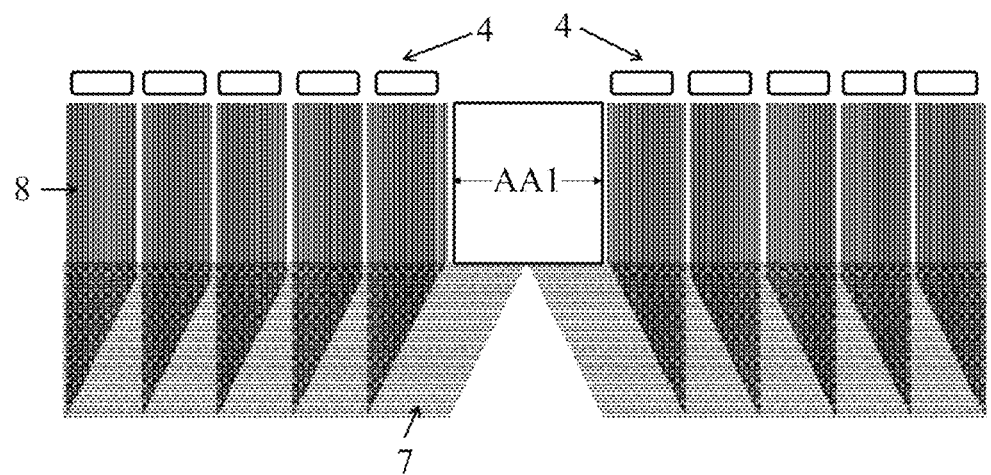
FIG. 5 is a wiring diagram of data signals of a first pixel driving circuit according to an embodiment of the present disclosure.
Figure 6:
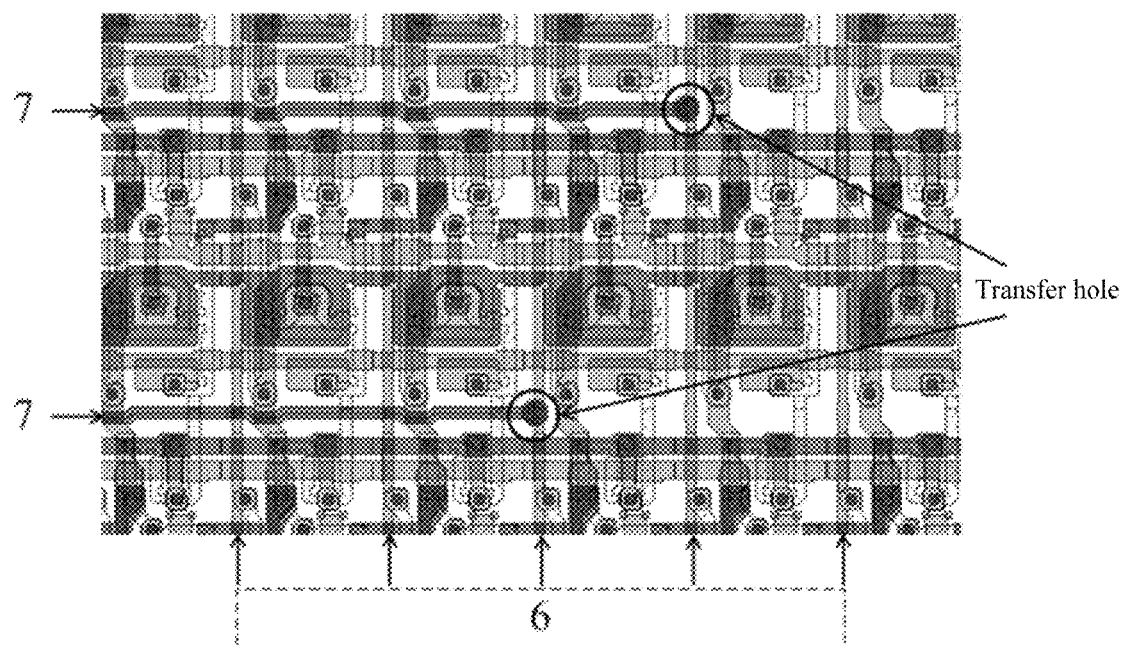
FIG. 6 is a transverse transfer diagram of data signals in a display area according to an embodiment of the present disclosure.

In some embodiments, in the display substrate provided in the embodiment of the present disclosure, as shown in FIGS. 3 to 5, all the first wires 7 may be located at a plurality of row gaps adjacent to the first display area AA1, and two first wires 7 are arranged at the same row gap; and all the second wires 8 are arranged at a plurality of column gaps adjacent to the first display area AA1 in one-to-one correspondence. In other words, after the data line 6 led out from a source driving integrated circuit (IC) end reaches the first display area AA1, the data line may be sequentially transferred to left and right sides of the first display area AA1 for arrangement by means of the first wires 7 row by row at a position of the first display area AA1 near the IC end, and then may be sequentially transferred to the first pixel driving circuit 4 by means of the second wires 8 column by column.

The row gap refers to a gap between pixel rows formed by the plurality of second light emitting devices 3 in the second display area AA2. The column gap refers to a gap between pixel columns formed by the plurality of second light emitting devices 3 in the second display area AA2.

In some embodiments, as shown in FIGS. 3 and 4, the display substrate provided in the embodiment of the present disclosure may further include: a plurality of first transfer lines 9 located in a portion of the bezel area BB adjacent to the first display area AA1, and each first transfer line 9 is correspondingly connected with one second wire 8 and one first pixel driving circuit 4. That is, the data signals provided by the second wires 8 are transferred to the corresponding first pixel driving circuits 4 via the first transfer lines 9.

In some embodiments, in the display substrate provided in the embodiment of the present disclosure, the plurality of data lines 6 and the plurality of first transfer lines 9 may be arranged in the same layer as the first source-drain metal layer, the plurality of first wires 7 may be arranged in the same layer as the second gate metal layer, and the plurality of second wires 8 may be arranged in the same layer as the second source-drain metal layer, such that longitudinally transferred data signals at a boundary of the display area AA may be re-transferred from the second source-drain metal layer where the second wires 8 are located to the first source-drain metal layer where the first transfer lines 9 are located, and then transferred to the corresponding first pixel driving circuits 4. The transfer holes may be determined according to an actual wiring condition, specific positions of which are not limited.

It should be understood that in the present disclosure, in the case of "arranged in the same layer", a layer structure is formed by using the same film forming process to form a film layer for making a specific pattern and using the same mask and a one-time patterning process. That is, the one-time patterning process corresponds to one mask (also called a photomask). According to different specific patterns, the one-time patterning process may include a plurality of exposure, development or etching processes, specific patterns in the formed layer structure may be continuous or not, and the specific patterns may also have different heights or different thicknesses.

In addition, as shown in FIG. 1, for the pixel driving circuits (for example, D_1 and D_2 in FIG. 1) placed in the upper bezel area BB1, a shift register GOA is added in the related art so as to provide driving signals for the pixel driving circuits, which is complicated and costly.

In view of this, as shown in FIGS. 3 and 4, the display substrate provided in the embodiment of the present disclosure may further include: a plurality of shift registers 10 cascaded in the bezel area BB, where each shift register 10 is correspondingly connected with the first pixel driving circuits 4 electrically connected with one row of first light emitting devices 2 and the second pixel driving circuits 5 electrically connected with one row of second light emitting devices 3, and the one row of the first light emitting devices 2 and the one row of the second light emitting devices 3 are arranged in the same row.

In the display substrate provided in the embodiment of the present disclosure, one shift register 10 is shared by the first pixel driving circuits 4 electrically connected with the first light emitting devices 2 in one row in the first display area AA1 and the second pixel driving circuits 5 corresponding to the second light emitting devices 3 arranged in the same row in the second display area AA2, such that synchronously scanning of the first pixel driving circuits 4 corresponding to the first light emitting devices 2 in the first display area AA1 and the second pixel driving circuits 5 corresponding to the first light emitting devices 2 in the second display area AA2 in the same row are achieved, and the situation that the shift register 10 is provided only for the first pixel driving circuits 4 corresponding to the first light emitting devices 2 in the first display area AA1 is avoided. In this way, a technical solution is simplified, and production cost is reduced.

In some embodiments, in the display substrate provided in the embodiment of the present disclosure, as shown in FIGS. 2 to 4, the bezel area BB includes: a first bezel area BB1 adjacent to the first display area AA1, a second bezel area BB2 opposite the first bezel area BB1, and a third bezel area BB3 and a fourth bezel area BB4 that are connected with the first bezel area BB1 and the second bezel area BB2. The second display area AA2 may be located between the first display area AA1 and the second bezel area BB2, between the first display area AA1 and the third bezel area BB3, and between the first display area AA1 and the fourth bezel area BB4. That is, the second display area AA2 may surround left, lower and right sides of the first display area AA1, and an upper boundary of the first display area AA1 coincides with an upper boundary of the second display area AA2. Certainly, the second display area AA2 may further surround a periphery of the first display area AA1, which is not limited herein.

In some embodiments, the plurality of first pixel driving circuits 4 may be located in the first bezel area BB1, and the plurality of shift registers 10 may be located in at least one of the third bezel area BB3 or the fourth bezel area BB4. The display substrate may further include: a plurality of connecting lines 11 located in at least one of the third bezel area BB3 or the fourth bezel area BB4 that are adjacent to the first display area AA1, and the first bezel area BB1, where one end of each connecting line 11 is correspondingly connected with one shift register 10, the other end of the connecting line is correspondingly connected with at least one first pixel driving circuit 4, and the first light emitting devices 2 electrically connected with the at least one first pixel driving circuit 4 are arranged in the same row. The plurality of connecting lines 11 are arranged nearby in the bezel area BB where the shift register 10 and the first pixel driving circuits 4 are located, such that a wiring length of the connecting lines 11 may be effectively reduced.

In some embodiments, in the display substrate provided in the embodiment of the present disclosure, as shown in FIGS. 3 and 4, the plurality of cascaded shift registers 10 are divided into two groups, where one group of cascaded shift registers 10 are at least located in the third bezel area BB3, and the other group of cascaded shift registers 10 are at least located in the fourth bezel area BB4. The plurality of first pixel driving circuits 4 may be located in the first bezel area BB1. The plurality of connecting lines 11 may be located in the third bezel area BB3 and the fourth bezel area BB4 that are adjacent to the first display area AA1, and the first bezel area BB1, where each connecting line 11 is electrically connected with one second shift register 10 and the plurality of first pixel driving circuits 4 corresponding to a half adjacent row of first light emitting devices 2 correspondingly. For example, in FIGS. 3 and 4, three left ones (that is, a half row) of six first light emitting devices 2 in a first row adjacent to the first bezel area BB1 may correspond to three left ones of six first pixel driving circuits 4 electrically connected at a left side of the first bezel area BB1 respectively, and three right ones (that is, a half row) of the six first light emitting devices 2 in the first row may correspond to three right ones of the six first pixel driving circuits 4 electrically connected at a right side in the first bezel area BB1 respectively. Three left ones (that is, a half row) of six first light emitting devices 2 in a second row may correspond to three right ones of six first pixel driving circuits 4 electrically connected at a left side of the first bezel area BB1 respectively, and three right ones (that is, a half row) of the six first light emitting devices 2 in the second row may correspond to three left ones of the six first pixel driving circuits 4 electrically connected at a right side in the first bezel area BB1 respectively. Accordingly, the four wires 11 may be electrically connected with the three right ones of the six first pixel driving circuits 4 at the left side, the three left ones of the six first pixel driving circuits 4 at the left side, the three left ones of the six first pixel driving circuits 4 at the left side, and the three right ones of the six first pixel driving circuits 4 at the right side correspondingly in the first bezel area BB1.

The plurality of first pixel driving circuits 4 are arranged in the upper bezel area BB1 adjacent to the first display area AA1, such that a length of a transparent wire for connecting the first pixel driving circuit 4 and the first light emitting device 2 may be effectively reduced, and further resistance of the transparent wire may be reduced, and long-range uniformity of a driving signal may be improved. In addition, two groups of cascaded shift registers 10 are arranged in the third bezel area BB3 and the fourth bezel area BB4 respectively, and all pixel driving circuits electrically connected with each row of light emitting devices may be provided with driving signals by two shift registers 10 correspondingly, such that a time difference of receiving driving signals between all the pixel driving circuits electrically and correspondingly connected with the light emitting devices in the same row may be effectively reduced, and a synchronous display effect is improved.

In some embodiments, the display substrate provided in the embodiment of the present disclosure includes: a first gate metal layer (Gate1), a second gate metal layer (Gate2), a first source-drain metal layer (SD1) and a second source-drain metal layer (SD2) that are stacked and insulated from each other, and the plurality of connecting lines 11 may be arranged in the same layer as at least one of the first gate metal layer, the second gate metal layer or the second source-drain metal layer. Generally, the shift registers 10, the first pixel driving circuits 4 and the second pixel driving circuits 5 may each have a plurality of transistors and at least one capacitor. A gate electrode of each transistor and a first electrode plate of the capacitor may be located at the first gate metal layer, a second electrode plate of the capacitor may be located at the second gate metal layer, and a source electrode and a drain electrode of each transistor may be located at the first source-drain metal layer.

In some embodiments, in the display substrate provided in the embodiment of the present disclosure, as shown in FIGS. 3, 4, 9 and 10, each group of cascaded shift registers 10 may include: a plurality of first cascaded shift registers 101 and a plurality of second cascaded shift registers 102, where the plurality of first shift registers 101 may be configured to provide a gate scan signal (Gate), and the plurality of second shift registers 102 may be configured to provide a light emitting control signal (EM). In this case, the plurality of connecting lines 11 may include: a plurality of first connecting lines 111 arranged in the same layer as at least one of the first gate metal layer, the second gate metal layer or the second source-drain metal layer, and a plurality of second connecting lines 112 arranged in the same layer as at least one of the first gate metal layer or the second gate metal layer, where each first connecting line 111 is electrically connected with one first shift register 101 and the plurality of first pixel driving circuits 4 corresponding to a half adjacent row of first light emitting devices 2 correspondingly; and each second connecting line 112 is electrically connected with one second shift register 102 and the plurality of first pixel driving circuits 4 corresponding to a half adjacent row of first light emitting devices 2 correspondingly.

Figure 7:
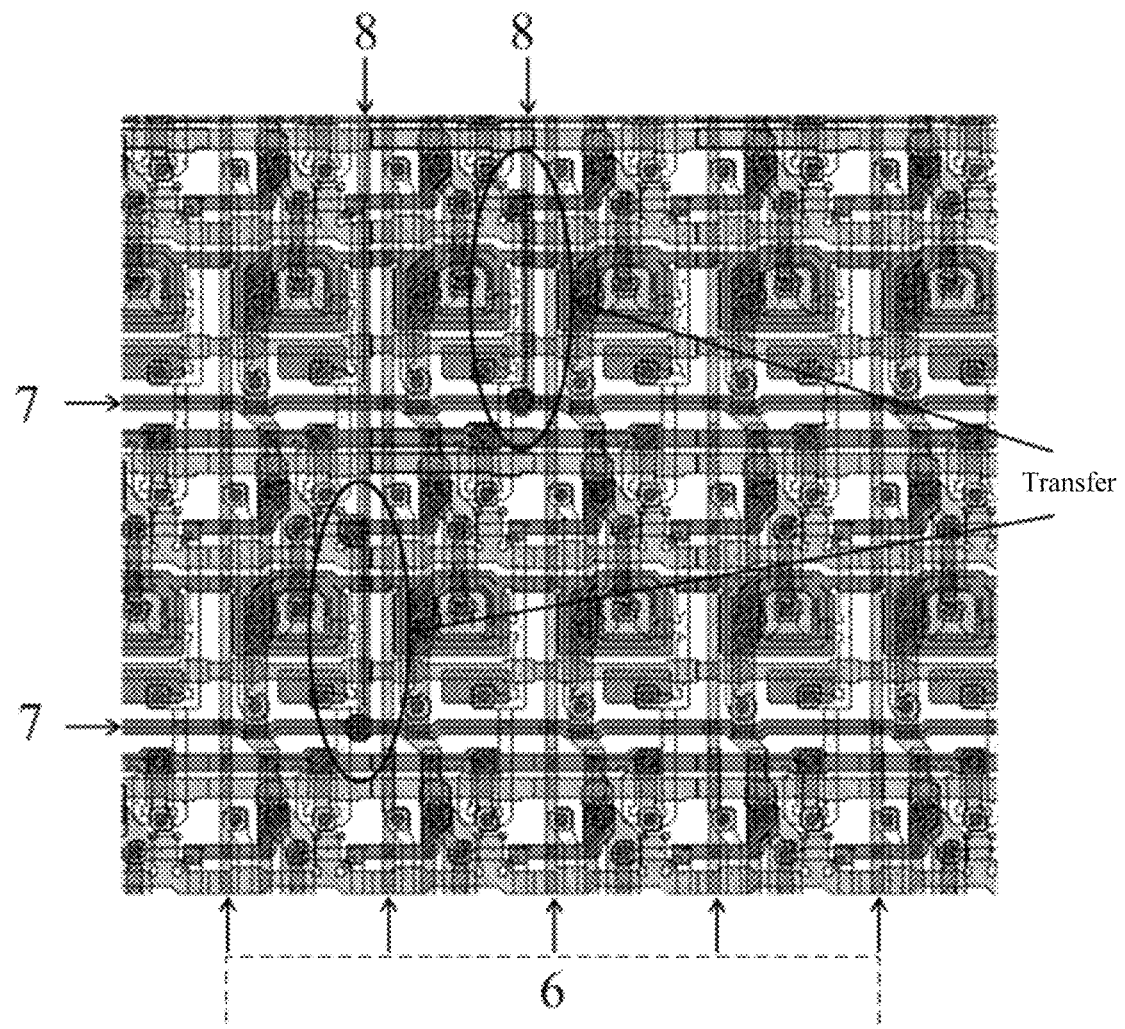
FIG. 7 is a longitudinal transfer diagram of data signals in a display area according to an embodiment of the present disclosure.
Figure 8:
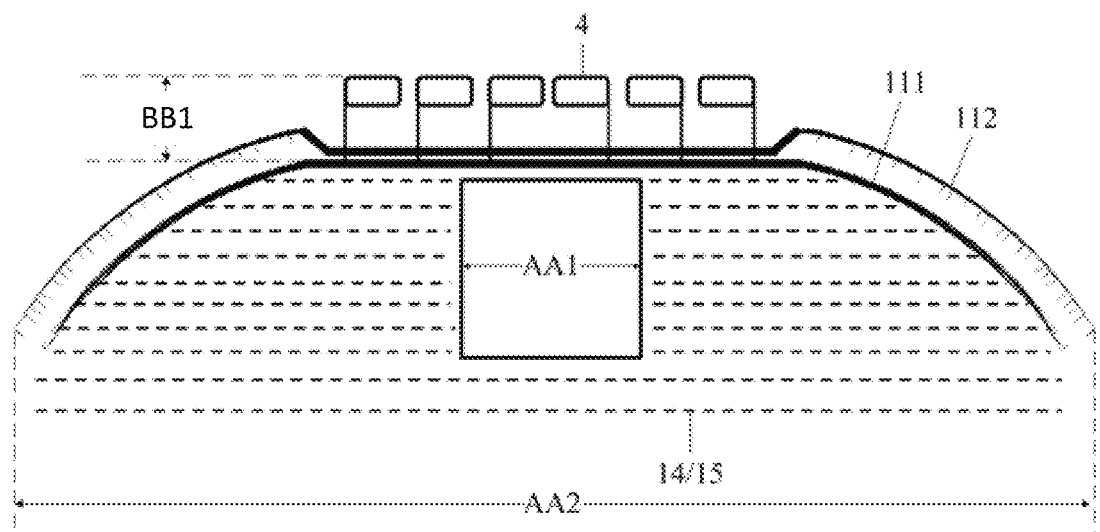
FIG. 8 is yet another enlarged schematic structural diagram of area a in FIG. 2.
Figure 9:
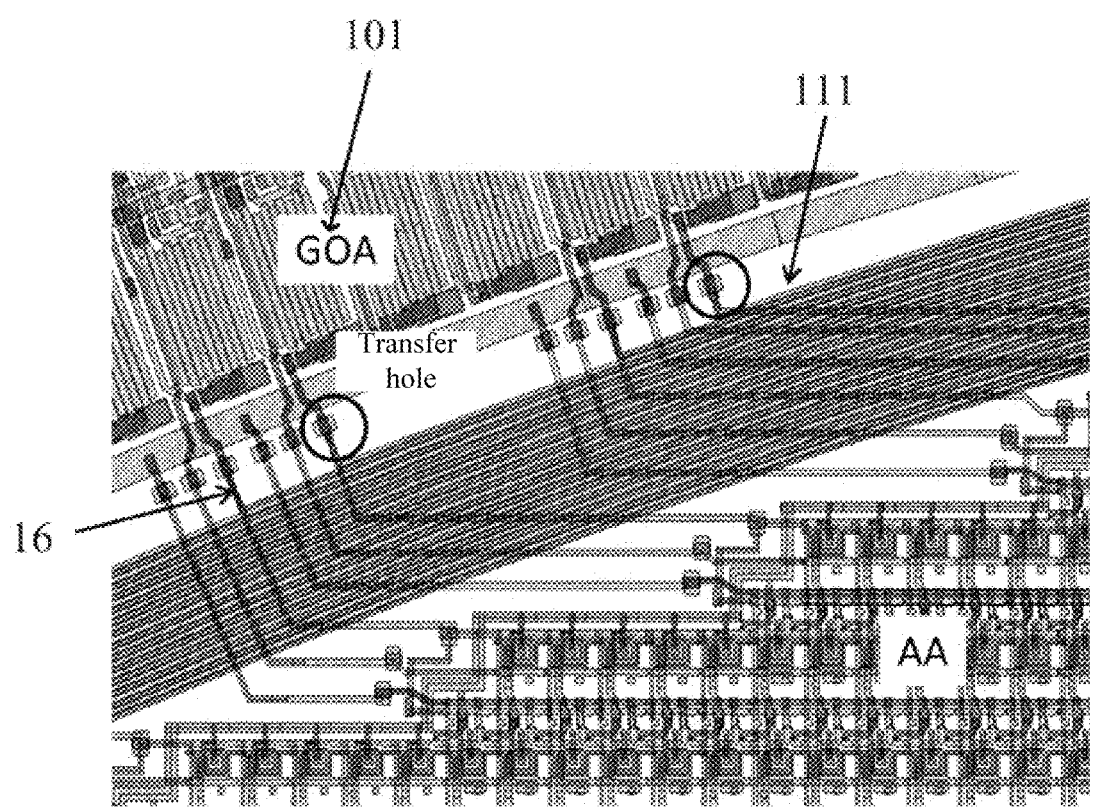
FIG. 9 is a signal wiring diagram of a first shift register according to an embodiment of the present disclosure.
Figure 10:
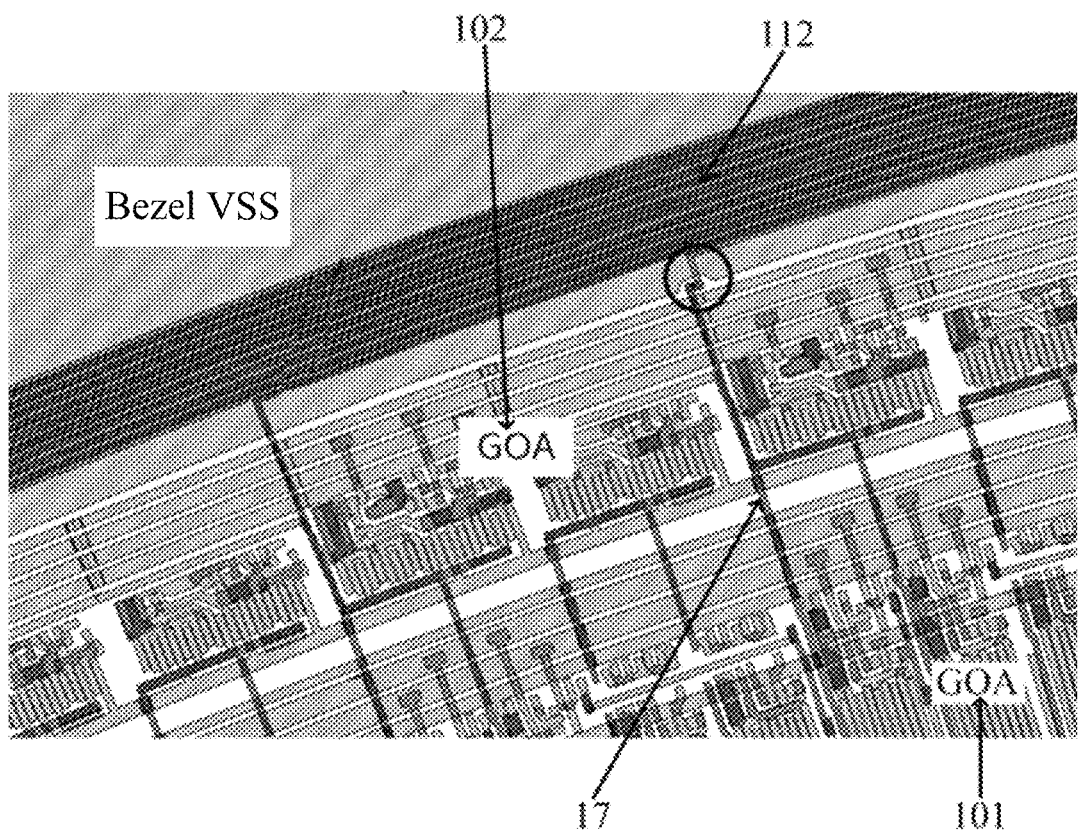
FIG. 10 is a signal wiring diagram of a second shift register according to an embodiment of the present disclosure.

The gate scan signal of the first shift register 101 is provided for the second pixel driving circuit 5 in the display area AA via the first source-drain metal layer, and the first connecting line 111 electrically connected with the first pixel driving circuit 4 may be transferred to the first gate metal layer, the second gate metal layer and the second source-drain metal layer for winding, where the first source-drain metal layer may be simply and conveniently transferred to the first gate metal layer, the second gate metal layer and the second source-drain metal layer via one transfer hole, so as to optimize a wiring mode. In some embodiments, the transfer holes are determined according to an actual wiring condition, specific positions of which are not limited. In addition, as shown in FIG. 7, in the related art, low-level (VSS) signal lines located at the first source-drain metal layer are distributed at one side of the shift register 10 farther away from the display area AA, so the second connecting line 112 for connecting the second shift register 102 to the first pixel driving circuit 4 may be transferred to the first gate metal layer and/or the second gate metal layer for winding, so as to reduce wiring pressure in the bezel area BB of shift registers 10 farther away from the display area AA.

In some embodiments, in the display substrate provided in the embodiment of the present disclosure, as shown in FIGS. 3, 4, 9 and 10, the plurality of first cascaded shift registers 101 are located between the plurality of second cascaded shift registers 102 and the display area AA; each first connecting line 111 may be bent from one side of the first shift register 101 closer to the display area AA to the first bezel area BB1 between the first pixel driving circuit 4 and the display area AA; and each second connecting line 112 may be bent from one side of the second shift register 102 farther away from the display area AA to the first bezel area BB1 between the first pixel driving circuit 4 and the display area AA.

It may be seen that the first connecting line 111 and the second connecting line 112 are connected with a position of the first pixel driving circuit 4 in the bezel area BB while avoiding the display area AA from two sides of the shift register 10, respectively, such that original signal lines (such as gate lines and light emitting control lines) electrically connected with the shift registers 10 in the display area AA may be prevented from being changed, and a wiring design of the first connecting lines 111 and the second connecting lines 112 is optimized. In addition, bent parts of the first connecting lines 111 and the second connecting lines 112 may be in an arc-shape as shown in FIG. 3 or a right-angled shape as shown in FIG. 4, which is not limited herein.

Figure 11:
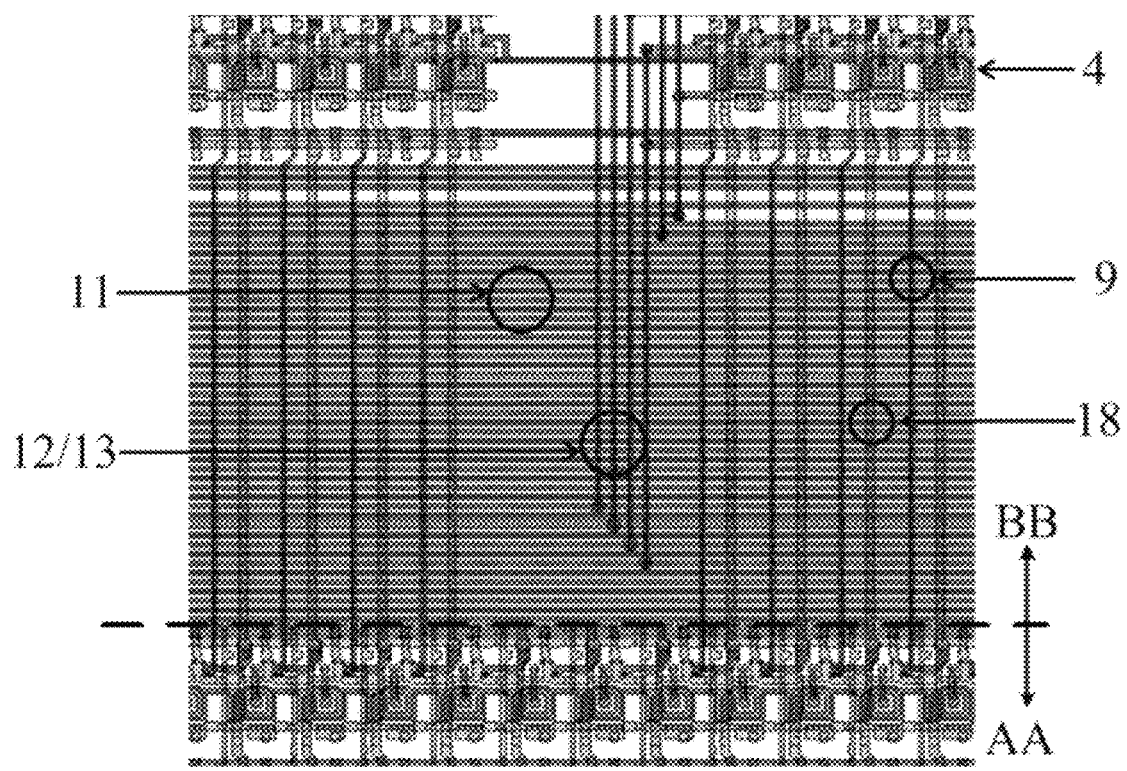
FIG. 11 is a signal transfer wiring diagram of a shift register according to an embodiment of the present disclosure.

In some embodiments, as shown in FIGS. 3 and 4, the display substrate provided in the embodiment of the present disclosure may further include: a plurality of second transfer lines 12 and a plurality of third transfer lines 13 arranged in the first bezel area BB1 and in the same layer as the first source-drain metal layer, where each second transfer line 12 is connected with one first connecting line 111 and one first pixel driving circuit 4, and each third transfer line 13 is connected with one second connecting line 112 and one first pixel driving circuit 4. In some embodiments, the plurality of second transfer lines 12 and the plurality of third transfer lines 13 may be longitudinally arranged in the first source-drain metal layer, so as to simply and conveniently transfer the plurality of first connecting lines 111 and second connecting lines 112 transversely arranged in the first bezel area BB1 via the transfer holes, as shown in FIG. 11.

In some embodiments, as shown in FIGS. 3, 4 and 8-10, the display substrate provided in the embodiment of the present disclosure may further generally include: a plurality of gate lines 14 and a plurality of light emitting control lines 15 arranged in the second display area AA2 and in the same layer as the first gate metal layer, and a plurality of fourth transfer lines 16 and a plurality of fifth transfer lines 17 arranged in the third bezel area BB3 and the fourth bezel area BB4 and in the same layer as the first source-drain metal layer, where each gate line 14 is electrically connected with a half row of second pixel driving circuits 5, and is electrically connected with one first shift register 101 by means of one fourth transfer line 16; and each light emitting control line 15 is electrically connected with a half row of second pixel driving circuits 5, and is electrically connected with one second shift register 102 by means of one fifth transfer line 17.

It may be seen from the above that in the present disclosure, the gate scan signal of the first shift register 101 is provided for the gate line 14 in the display area AA via the fourth transfer line 16 of the first source-drain metal layer, the light emitting control signal of the second shift register 102 is provided for the light emitting control line 15 in the display area AA via the fifth transfer line 17 of the first source-drain metal layer, and an original wiring mode of the gate lines 14 and the light emitting control lines 15 is unchanged, such that high compatibility with the related art is achieved.

Figure 12:
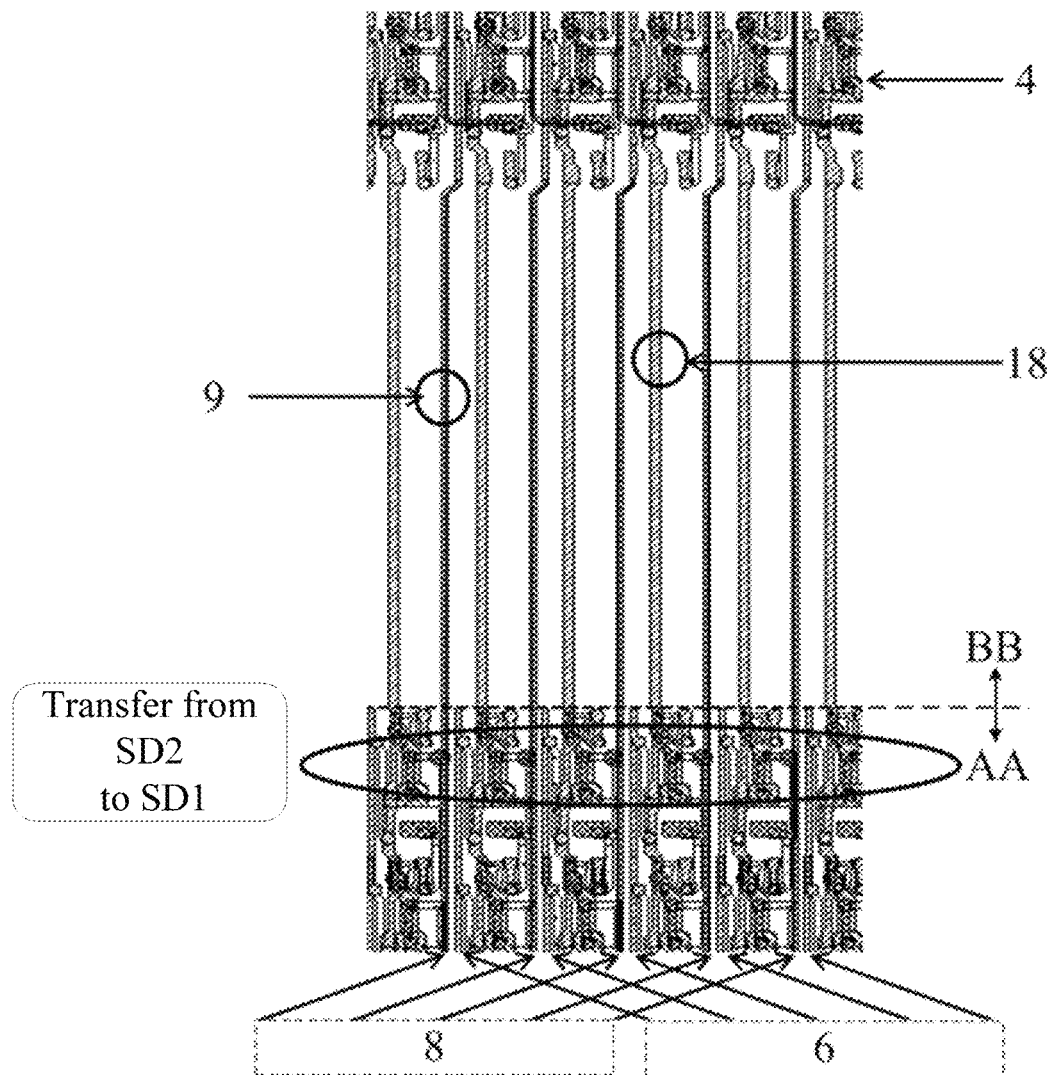
FIG. 12 is a longitudinal transfer diagram of data signals and power signals in a bezel area according to an embodiment of the present disclosure.

In some embodiments, as shown in FIG. 12, the display substrate provided in the embodiment of the present disclosure may further include: a plurality of power signal (VDD) lines 18 extending in the column direction, where one power signal line 18 is electrically connected with one column of the second pixel driving circuits 5, and, one power signal line 18 is electrically connected with the first pixel driving circuits 4 and the second pixel driving circuits 5 in the same column. In some embodiments, the power signal line 18 may be directly connected from the display area AA to the first pixel driving circuit 4 in the bezel area BB through the first source-drain metal layer.

In some embodiments, the display substrate provided in the embodiment of the present disclosure may further include: a plurality of initialization signal (Vinit) lines extending in the row direction in the second display area AA2 and a plurality of sixth transfer lines located in the bezel area BB, where one initialization signal line is electrically connected with a half row of second pixel driving circuits 5, and each initialization signal line located at two sides of the first display area AA1 in the row direction is further electrically connected with the first pixel driving circuits 5 corresponding to the row of first light emitting devices 2 by means of one sixth transfer line. In some embodiments, a setting mode of the initialization signal lines may further be similar to that of the power signal lines 18, which is not limited herein.

Figure 13:
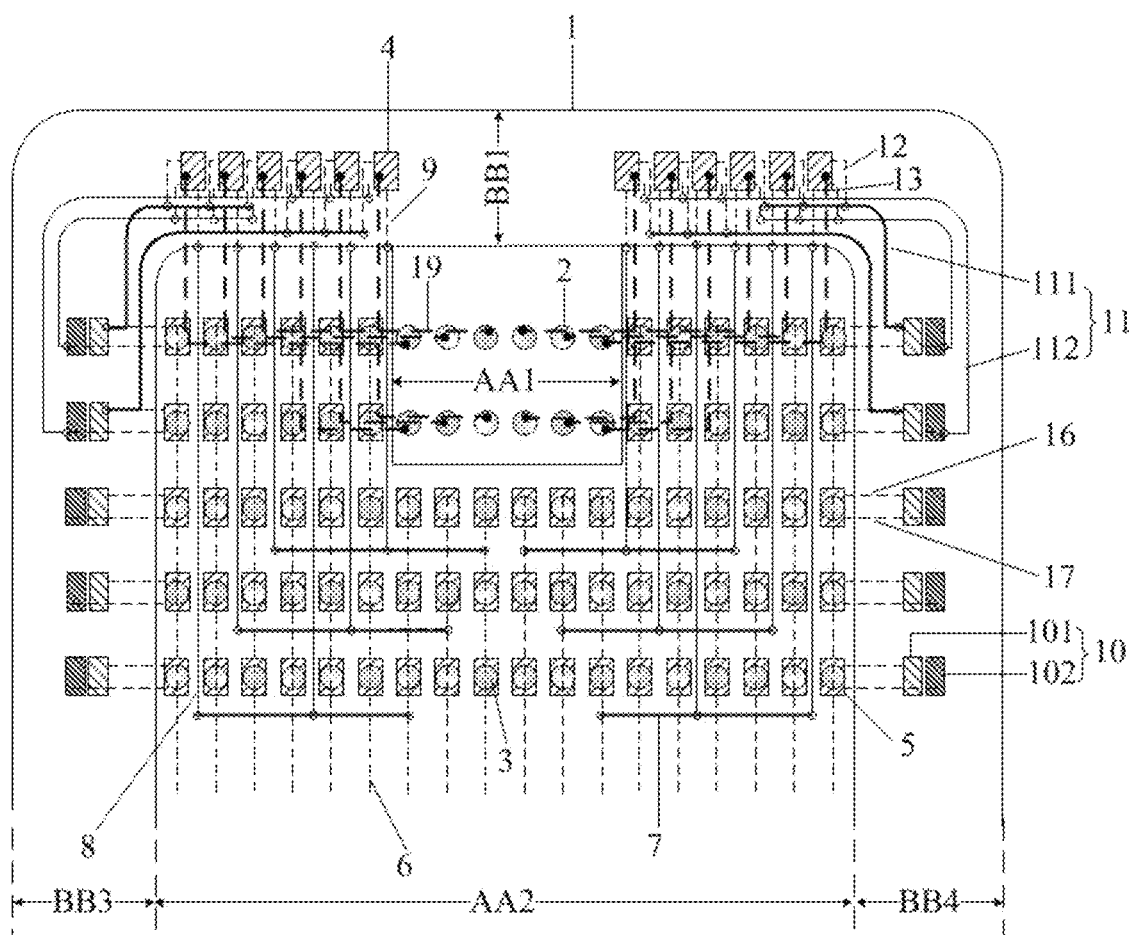
FIG. 13 is yet another enlarged schematic structural diagram of area a in FIG. 2.
Figure 14:
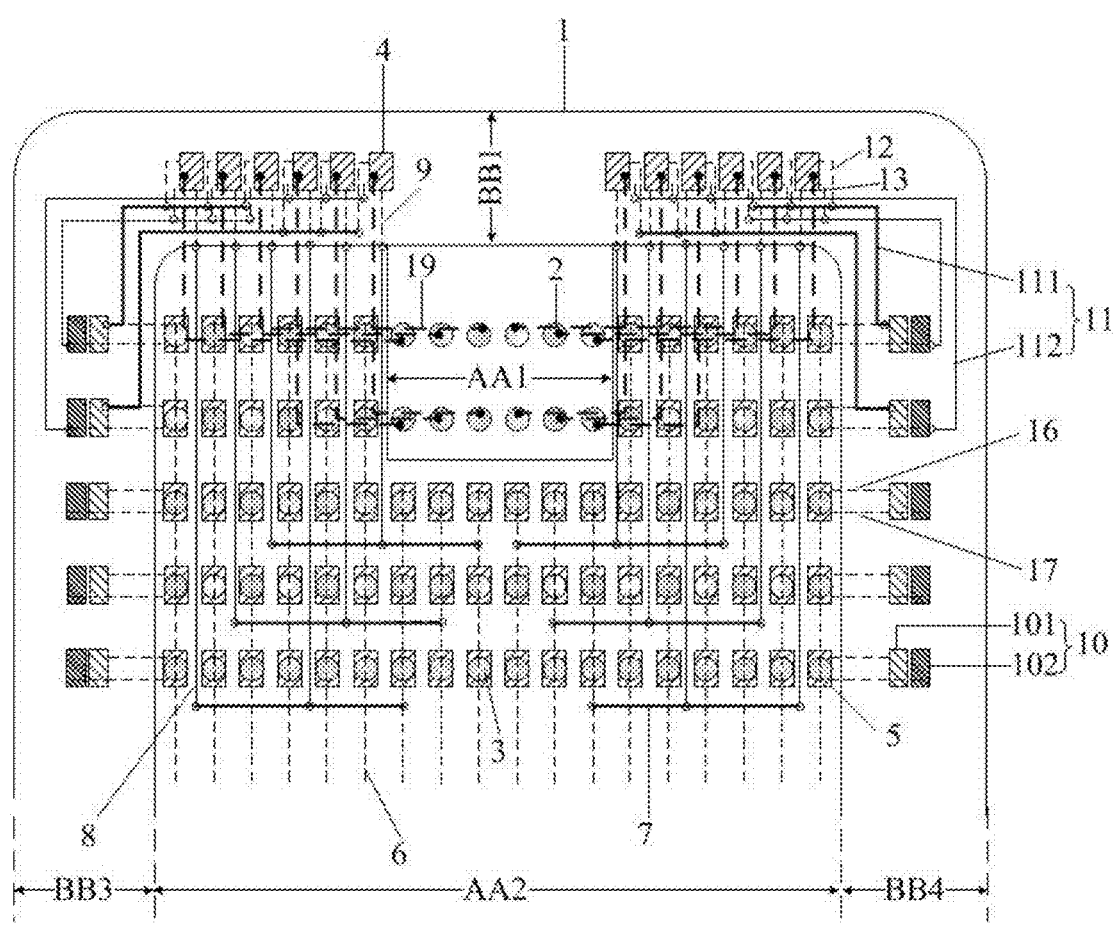
FIG. 14 is still another enlarged schematic structural diagram of area a in FIG. 2.

In some embodiments, as shown in FIGS. 13 and 14, the display substrate provided in the embodiment of the present disclosure may further include: a plurality of transparent wires 19 located between a layer where the plurality of pixel driving circuits are located and a layer where the plurality of light emitting devices are located, where each transparent wire 19 is correspondingly connected between the first pixel driving circuit 4 and the first light emitting device 2.

In some embodiments, in order to provide more transparent wires 19 within a certain size range in the column direction to drive more first light emitting devices 3, and further satisfy the same resolution of the first display area AA1 and the second display area AA2, the plurality of transparent wires 19 may be arranged in different film layers in the present disclosure. In some embodiments, the plurality of transparent wires 19 may be located in a first transparent conductive layer, a second transparent conductive layer and a third transparent conductive layer, respectively. The plurality of first light emitting devices 2 include a plurality of first color light emitting devices R, a plurality of second color light emitting devices G, and a plurality of third color light emitting devices B. The first pixel driving circuit 4 includes a first pixel sub-circuit, a second pixel sub-circuit, and a third pixel sub-circuit. One end of the transparent wire 19 in the first transparent conductive layer may be electrically connected with the first pixel sub-circuit, and the other end of the transparent wire may be electrically connected with the corresponding first color light emitting device R. One end of the transparent wire 19 in the second transparent conductive layer may be electrically connected with the second pixel sub-circuit, and the other end of the transparent wire may be electrically connected with the corresponding second color light emitting device G. One end of the transparent wire 19 in the third transparent conductive layer may be electrically connected with the third pixel sub-circuit, and the other end of the transparent wire may be electrically connected with the corresponding third color light emitting device B.

In some embodiments, in the display substrate provided in the embodiment of the present disclosure, the first display area AA1 is configured for a light extraction device to be mounted, for example, a camera module, an optical fingerprint identification module, an ambient light sensor, etc.

In another aspect, an embodiment of the present disclosure further provides a display panel, which includes the display substrate provided in the embodiment of the present disclosure. In some embodiments, the display panel may be an organic light emitting diode (OLED) display panel, a quantum-dot light emitting diode (QLED) display panel, or a micro light emitting diode (LED) display panel. A problem solving principle of the display panel is similar to a problem solving principle of the display substrate, so reference may be made to implementation of the display substrate provided in the embodiment of the present disclosure for implementation of the display panel provided in the embodiment of the present disclosure, which will not be repeated herein.

In another aspect, an embodiment of the present disclosure further provides a display device. The display device includes: a light extraction device (for example, a camera module), and the display panel, where the light extraction device is arranged in a first display area AA1 of the display panel. The display device may be any product or component with a display function, such as a mobile phone, a tablet computer, a television, a display screen, a notebook computer, a digital photo frame, a navigator, a smart watch, a fitness wristband, and a personal digital assistant. Other essential components of the display device should be understood by those of ordinary skill in the art, which will not be repeated herein and should not limit the present disclosure. In addition, a problem solving principle of the display device is similar to a problem solving principle of the display panel, so reference may be made to implementation of the display panel for implementation of the display device, which will not be repeated herein.

Apparently, those skilled in the art can make various modifications and variations to the embodiments of the present disclosure without departing from the spirit and scope of the embodiments of the present disclosure. In this way, if the modifications and variations of the embodiments of the present disclosure fall within the scope of the claims of the present disclosure and their equivalent technologies, the present disclosure is also intended to include the modifications and variations.

What is claimed is:

1. A display substrate, comprising:
a base substrate, wherein the base substrate comprises a display area and a bezel area surrounding the display area, the display area comprises a first display area and a second display area at least located at a side of the first display area;
a plurality of light emitting devices, arranged in an array on the base substrate, wherein the plurality of light emitting devices comprise a plurality of first light emitting devices in the first display area and a plurality of second light emitting devices in the second display area;
a plurality of pixel driving circuits, arranged between the base substrate and the plurality of light emitting devices, wherein the plurality of pixel driving circuits comprise: a plurality of first pixel driving circuits in the bezel area and a plurality of second pixel driving circuits in the second display area, the plurality of first pixel driving circuits are electrically connected with the plurality of first light emitting devices, and the plurality of second pixel driving circuits are electrically connected with the plurality of second light emitting devices;
a plurality of data lines, arranged in the second display area, wherein each of the plurality of data line is connected with the first pixel driving circuits electrically connected with one column of the first light emitting devices and the second pixel driving circuits electrically connected with one column of the second light emitting devices, and the one column of the first light emitting devices and the one column of the second light emitting devices are arranged in a same column; and a plurality of first wires in the second display area and extending in a row direction, wherein the plurality of first wires are located at a plurality of row gaps adjacent to the first display area respectively, each of the plurality of first wires is connected between one data line corresponding to the first display area and one first pixel driving circuit corresponding to the one data line.

2. The display substrate according to claim 1, further comprising: a plurality of cascaded shift registers in the bezel area;

wherein each of the plurality of cascaded shift register is correspondingly connected with the first pixel driving circuits electrically connected with one row of the first light emitting devices and the second pixel driving circuits electrically connected with one row of the second light emitting devices; and the one row of the first light emitting devices and the one row of the second light emitting devices are arranged in a same row.

3. The display substrate according to claim 2, wherein the bezel area comprises: a first bezel area adjacent to the first display area, a second bezel area opposite the first bezel area, and a third bezel area connected with the first bezel area and the second bezel area, and a fourth bezel area connected with the first bezel area and the second bezel area;

the plurality of first pixel driving circuits are arranged in the first bezel area;

the plurality of cascaded shift registers are arranged in at least one of the third bezel area or the fourth bezel area; and wherein the display substrate further comprises:

a plurality of connecting lines are arranged in at least one of: the third bezel area adjacent to the first display area, the fourth bezel area adjacent to the first display area, or the first bezel area;

one end of each of the plurality of connecting lines is correspondingly connected with one shift register, the other end of each of the plurality of connecting line is correspondingly connected with at least one first pixel driving circuit; and the first light emitting devices electrically connected with at least one first pixel driving circuit are arranged in a same row.

4. The display substrate according to claim 3, wherein the plurality of cascaded shift registers are divided into two groups, wherein one group of cascaded shift registers are at least arranged in the third bezel area, and the other group of cascaded shift registers are at least arranged in the fourth bezel area;

the plurality of first pixel driving circuits are arranged in the first bezel area; and the plurality of connecting lines are arranged in the third bezel area adjacent to the first display area, the fourth bezel area adjacent to the first display area, and the first bezel area;

wherein each of the plurality of connecting lines is correspondingly connected with one shift register and the plurality of first pixel driving circuits adjacent to a half row of first light emitting devices.

5. The display substrate according to claim 4, comprising: a first gate metal layer, a second gate metal layer, a first source-drain metal layer and a second source-drain metal layer;

wherein the first gate metal layer, the second gate metal layer, the first source-drain metal layer and the second source-drain metal layer are stacked and insulated from each other;

the plurality of connecting lines are arranged in a same layer as at least one of the first gate metal layer, the second gate metal layer or the second source-drain metal layer.

6. The display substrate according to claim 5, wherein each group of cascaded shift registers comprise: a plurality of first cascaded shift registers and a plurality of second cascaded shift registers; and the plurality of connecting lines comprise:

a plurality of first connecting lines arranged in a same layer as at least one of the first gate metal layer, the second gate metal layer or the second source-drain metal layer; and a plurality of second connecting lines arranged in a same layer as at least one of the first gate metal layer or the second gate metal layer;

wherein each of the plurality of first connecting lines is electrically connected with one first shift register and the plurality of first pixel driving circuits adjacent to a half row of first light emitting devices correspondingly; and each of the plurality of second connecting lines is electrically connected with one second shift register and the plurality of first pixel driving circuits adjacent to a half row of first light emitting devices correspondingly.

7. The display substrate according to claim 6, wherein the plurality of first cascaded shift registers are arranged between the plurality of second cascaded shift registers and the display area;

each of the plurality of first connecting lines is bent from one side of the first shift register closer to the display area to the first bezel area between the first pixel driving circuit and the display area; and each of the plurality of second connecting lines is bent from one side of the second shift register farther away from the display area to the first bezel area between the first pixel driving circuit and the display area.

8. The display substrate according to claim 7, further comprising: a plurality of second transfer lines and a plurality of third transfer lines arranged in the first bezel area and in a same layer as the first source-drain metal layer, wherein each of the plurality of second transfer lines is connected with one first connecting line and one first pixel driving circuit; and each of the plurality of third transfer lines is connected with one second connecting line and one first pixel driving circuit.

9. The display substrate according to claim 8, further comprising: a plurality of gate lines and a plurality of light emitting control lines arranged in the second display area and in a same layer as the first gate metal layer; and a plurality of fourth transfer lines and a plurality of fifth transfer lines arranged in the third bezel area and the fourth bezel area and in a same layer as the first source-drain metal layer, wherein each of the plurality of gate lines is electrically connected with a half row of second pixel driving circuits, and the each of the plurality of gate lines is electrically connected with one first shift register by means of one fourth transfer line; and each of the plurality of light emitting control lines is electrically connected with a half row of second pixel driving circuits, and the each of the plurality of light emitting control lines is electrically connected with one second shift register by means of one fifth transfer line.

10. The display substrate according to claim 1, further comprising: a plurality of second wires in the second display area and extending in a column direction;
  wherein the plurality of second wires are arranged at a plurality of column gaps at two sides of the first display area in the row direction;
  each of the plurality of second wires is electrically connected between one first wire and one first pixel driving circuit corresponding to the one first wire; and
  each of the plurality of second wires is electrically connected with the one first pixel driving circuit.

11. The display substrate according to claim 10, wherein the one data line corresponding to the first display area is connected with at least one of the plurality of second wires by means of one first wire;
  all first light emitting devices connected with the at least one of the plurality of second wires connected with the one first wires are located in a same column.

12. The display substrate according to claim 11, wherein the plurality of first pixel driving circuits are electrically connected with the plurality of first light emitting devices in one-to-one correspondence, and the plurality of second pixel driving circuits are electrically connected with the plurality of second light emitting devices in one-to-one correspondence.

13. The display substrate according to claim 12, wherein a number of the all second wires connected with the one first wire is equal to a number of the first light emitting devices in one column in the first display area.

14. The display substrate according to claim 10, further comprising: a plurality of first transfer lines arranged in a portion of the bezel area adjacent to the first display area, wherein
  each first transfer line is correspondingly connected with one second wire and one first pixel driving circuit.

15. The display substrate according to claim 14, comprising: a first gate metal layer, a second gate metal layer, a first source-drain metal layer and a second source-drain metal layer, wherein the first gate metal layer, the second gate metal layer, the first source-drain metal layer and the second source-drain metal layer are stacked and insulated from each other;
  the plurality of data lines and the plurality of first transfer lines are arranged in a same layer as the first source-drain metal layer;
  the plurality of first wires are arranged in a same layer as the second gate metal layer; and
  the plurality of second wires are arranged in a same layer as the second source-drain metal layer.

16. The display substrate according to claim 1, wherein two first wires of the plurality of first wires are arranged at a same row gap in the second display area.

17. The display substrate according to claim 16, wherein the two first wires arranged at a same row gap are symmetrically arranged about a first axis of symmetry of the first display area;
  wherein the first axis of symmetry is an axis of symmetry of the first display area extending in a column direction.

18. The display substrate according to claim 17, wherein a first end of the first wire is connected with the data line;
  a distance between first ends of the two first wires arranged at the same row gap is a first distance;
  the first distance gradually increases in the column direction far away from the first display area.

19. The display substrate according to claim 1, further comprising: a plurality of power signal lines extending in a column direction;
  wherein one power signal line is electrically connected with one column of the second pixel driving circuits, or one power signal line is electrically connected with the first pixel driving circuits and the second pixel driving circuits in a same column;
  wherein the display substrate further comprising: a plurality of initialization signal lines extending in a row direction in the second display area, and a plurality of sixth transfer lines arranged in the bezel area, wherein one initialization signal line is electrically connected with a half row of second pixel driving circuits; and
  each of the plurality of initialization signal lines located at two sides of the first display area in the row direction is further electrically connected with the first pixel driving circuits corresponding to a row of first light emitting devices by means of one sixth transfer line.

20. A display device, comprising: a light extraction device, and the display substrate according to claim 1;
  wherein the light extraction device is arranged in a first display area of the display substrate;
  the light extraction device comprises a camera component, an optical fingerprint recognition component, or an ambient light sensor.

* * * * *